(12) United States Patent
Chou

(10) Patent No.: US 7,483,768 B2
(45) Date of Patent: Jan. 27, 2009

(54) ADAPTIVE POWER MANAGING DEVICE AND METHOD

(75) Inventor: Yu Pin Chou, Tunghsiao Town (TW)

(73) Assignee: Realtek Semiconductor Corp., Science Park, HsinChu (TW)

( * ) Notice: Subject to any disclaimer, the term of this patent is extended or adjusted under 35 U.S.C. 154(b) by 531 days.

(21) Appl. No.: 11/166,203

(22) Filed: Jun. 27, 2005

(65) Prior Publication Data

US 2006/0013055 A1    Jan. 19, 2006

(30) Foreign Application Priority Data

Jul. 14, 2004    (TW) .............................. 93121049 A

(51) Int. Cl.
*G06F 19/00* (2006.01)
(52) U.S. Cl. ...................... 700/298; 445/164
(58) Field of Classification Search ......... 700/289–290, 700/297–298; 445/164, 182; 345/211; 257/700, 257/706; 438/106
See application file for complete search history.

(56) References Cited

U.S. PATENT DOCUMENTS

| | | | | |
|---|---|---|---|---|
| 4,429,415 A | * | 1/1984 | Chin et al. ............... | 455/164.1 |
| 5,303,398 A | * | 4/1994 | Tults ....................... | 455/182.1 |
| 7,237,121 B2 | * | 6/2007 | Cammack et al. ........... | 713/189 |
| 2003/0031072 A1 | * | 2/2003 | Louzoun et al. ............. | 365/220 |

* cited by examiner

*Primary Examiner*—Kidest Bahta
(74) *Attorney, Agent, or Firm*—Winston Hsu

(57) ABSTRACT

An adaptive power managing device for an IC chip or a circuit system comprises a tunable voltage generator, a data generator, a data processing unit, a data checking unit and a control unit; the tunable voltage generator is used for providing the IC chip or the circuit system with an operating voltage; the data generator is used for generating a series of predetermined data to the data processing unit; the data processing unit is used for processing the series of predetermined data and then outputting a series of output data associated with the series of predetermined data; and the data checking unit is used for checking the validity of the series of output data; wherein if the series of output data is checked to be invalid, the control unit outputs a control signal for tuning up the operating voltage; if the series of output data is checked to be valid, the operating voltage is maintained or the control unit outputs another control signal for tuning down the operating voltage whereby efficiently achieving the objective of power management. The present invention also provides an adaptive power managing method.

24 Claims, 2 Drawing Sheets

US 7,483,768 B2

ADAPTIVE POWER MANAGING DEVICE AND METHOD

CROSS REFERENCE TO RELATED APPLICATION

This application claims the priority benefit of Taiwan Patent Application Serial Number 093121049, filed on Jul. 14, 2004, the full disclosure of which is incorporated herein by reference.

BACKGROUND OF THE INVENTION

1. Field of the Invention

This invention generally relates to a power managing device and method, and more particularly to an adaptive power managing device and method.

2. Description of the Related Art

Generally, when a circuit is implemented on an IC chip or a circuit system, the power source supplied to the circuit is maintained at a specific voltage which may be generated from a voltage generator disposed outside the IC chip or from an embedded voltage generator disposed inside the IC chip. However, the specific voltage, regardless of where it is generated, is a constant voltage and should be designed under many considerations. For example:

(1) When an IC chip is supposed to be operated at a voltage range between 3.3V±10%, a voltage around 3V should be enough to make the IC chip operate normally. However, an internal or external voltage generator may still provide the IC chip with a voltage more than 3V (e.g. 3.3V) under some considerations, e.g. mass production issues and various unexpected conditions, in order to cover or tolerate any unexpected result caused by any mass production issue or unexpected condition. In such a manner, unnecessary power consumption for the IC chip may be caused. Therefore, according to the equation of power consumption $P=F*C*V^2$ (F=frequency, C=load capacitance, V=voltage), if the IC chip can actively detect that 3V is enough to make the IC chip itself operate normally, the power consumption of the IC chip operated at 3V can be only 82.6% (i.e. $(3V/3.3V)^2*100\%$) of the power consumption of the IC chip operated at 3.3V whereby saving the power consumption and efficiently reducing the electromagnetic interference (EMI) of the IC chip itself.

(2) In some critical conditions, the performances (e.g. speed) of the IC chip may be under specification or criteria due to unsatisfactory processes or designing margins. Such critical conditions may be overcome by the manner of providing and compensating the IC chip with a higher operating voltage.

Accordingly, the present invention provides an adaptive power managing device and method for an IC chip or a circuit system.

SUMMARY OF THE INVENTION

It is therefore an object of the present invention to provide an adaptive power managing device and method for solving the above-mentioned problems.

It is an object of the present invention to provide an adaptive power managing device and method for making an IC chip or a circuit system adaptively tune its operating voltage.

In order to achieve the above object, an embodiment of the present invention discloses the adaptive power managing device and method which can check the validity of a series of output data generated from the IC chip or the circuit system, wherein if the series of output data is checked to be invalid, the IC chip or the circuit system can adaptively and actively tune up the operating voltage thereof; further, if the series of output data is checked to be valid, the IC chip or the circuit system will have the operating voltage maintained or adaptively and actively tune down the operating voltage.

BRIEF DESCRIPTION OF THE DRAWINGS

Other objects, advantages, and novel features of the present invention will become more apparent from the following detailed description when taken in conjunction with the accompanying drawings.

DETAILED DESCRIPTION OF THE PREFERRED EMBODIMENT

Figure 1:
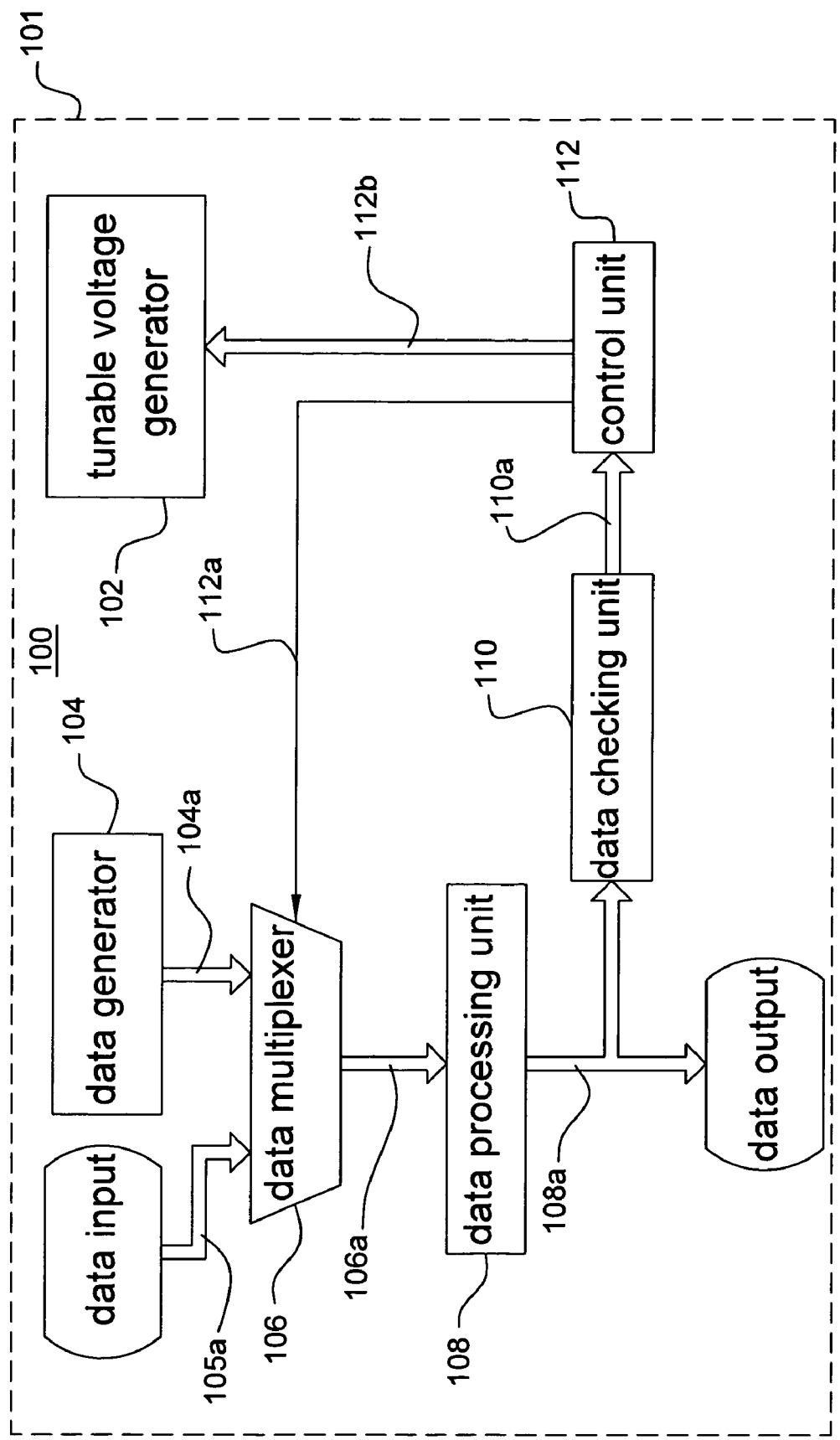
FIG. 1 is a circuit block diagram of an adaptive power managing device according to one embodiment of the present invention.

FIG. 1 is a circuit block diagram of an adaptive power managing device 100 according to one embodiment of the present invention. The adaptive power managing device 100 is applied to a circuit system, wherein the circuit system is referred to any circuit system capable of processing data and preferably implemented as a integrated circuit (IC) chip. In this embodiment, the circuit system is an IC chip 101, which is indicated by a dotted frame as shown in FIG. 1.

The adaptive power managing device 100 comprises a tunable voltage generator 102, a data generator 104, a data multiplexer 106, a data processing unit 108, a data checking unit 110 and a control unit 112. The tunable voltage generator 102 is used for providing the IC chip 101 with an operating voltage and can be selectively disposed outside the IC chip 101. The data generator 104 is used for generating a series of predetermined data 104a and can be selectively disposed outside the IC chip 101. The data multiplexer 106 has two inputs, a select line and an output, wherein the two inputs are respectively used for receiving the series of predetermined data 104a and a series of external data 105a, and the select line is electrically connected to the control unit 112 for receiving a selecting signal 112a generated by the control unit 112. The series of external data 105a is a data input obtained from a circuit (not shown) inside or outside the IC chip 101. The data processing unit 108 is used for receiving and processing a series of data 106a generated from the data multiplexer 106 and for outputting a series of output data 108a associated with the series of data 106a. The data checking unit 110 is used for checking the series of output data 108a and outputting a resulting signal 110a presenting the validity or invalidity of the series of output data 108a. The control unit 112 is used for receiving the resulting signal 110a and determining whether to tune the operating voltage provided by the tunable voltage generator 102 according to the resulting signal 110a.

According to one embodiment of the present invention, the operation of the adaptive power managing device 100 will be described below. Firstly, the control unit 112 sends the selecting signal 112a to the data multiplexer 106 such that the series of predetermined data 104a can be selected and outputted as the series of data 106a through the data multiplexer 106. The data processing unit 108 is a data processing circuit disposed on the IC chip 101, and used for receiving and processing the series of data 106a through a specific operational process and then outputting the series of output data 108a in response to the series of data 106a. In addition, since the series of predetermined data 104a and the specific operational process of the data processing unit 108 are known before the processing unit 108 is operated, the series of output data 108a outputted from the data processing unit 108 can be anticipated in advance. For example, if the data processing unit 108 is a complementary processing unit and the series of predetermined data 104a is "1010", then the series of output data 108a outputted from the data processing unit 108 should be "0101" as anticipated.

After being outputted from the data processing unit 108, the series of output data 108a is received by the data checking unit 110. The data checking unit 110 can utilize a code checking criterion, e.g. CRC (Cyclical Redundancy Check) or BER (Bit Error Rate) criterion, to check the validity of the series of output data 108a. The data checking unit 110 has a code checking table, which records valid checking codes (e.g. CRC code or BER code) corresponding to the anticipated series of output data 108a, wherein the valid checking codes are used to be compared with the practical checking codes of the outputted series of output data 108a practically processed through the data processing unit 108. If the practical checking codes are identical to the valid checking codes recorded by the code checking table, the outputted series of output data 108a is valid. On the contrary, if not identical, the outputted series of output data 108a is invalid.

After checking the validity of the series of output data 108a, the data checking unit 110 outputs the resulting signal 110a to the control unit 112 wherein the resulting signal 110a is used for presenting the validity or invalidity of the series of output data 108a. For example, if the series of output data 108a is valid, the resulting signal 110a will present a high logic voltage level "1"; on the contrary, if the series of output data 108a is invalid, the resulting signal 110a will present a high logic voltage level "0".

Generally, if the series of output data 108a is valid, it means that the operating voltage provided by the tunable voltage generator 102 is proper such that the IC chip 101 can properly process the series of predetermined data 104a and thus obtain a valid series of output data 108a. On the contrary, if the series of output data 108a is invalid, it means that the operating voltage provided by the tunable voltage generator 102 is improper or insufficient such that the IC chip 101 cannot properly process the series of predetermined data 104a and thus obtain an invalid series of output data 108a.

The adaptive power managing device 100 according to the present invention is characterized in that the control unit 112 can determine whether to tune the tunable voltage generator 102 according to the resulting signal 110a after the data checking unit 110 checks the validity of the series of output data 108a.

When the resulting signal 110a presents that the series of output data 108a is valid, it means that the operating voltage provided by the tunable voltage generator 102 is proper; meanwhile, the control unit 112 sends the selecting signal 112a to the data multiplexer 106 such that the series of external data 105a can be selected and outputted as the series of data 106a through the data multiplexer 106. Hereafter, the IC chip 101 can begin processing the series of external data 105a. When the IC chip 101 processes the series of external data 105a, the series of external data 105a is transmitted to the data processing unit 108 through the data multiplexer 106 and processed by the data processing unit 108, and then outputted from the data processing unit 108 as a data output and transmitted to an internal circuit (not shown) disposed on the IC chip 101 or an external circuit (not shown) disposed out of the IC chip 101 without entering the data checking unit 110.

Alternatively, when the resulting signal 110a presents that the series of output data 108a is valid, the control signal 112 outputs a controlling signal 112b for tuning down the operating voltage of the tunable voltage generator 102. Meanwhile, the control unit 112 again sends the selecting signal 112a to the data multiplexer 106 such that the series of predetermined data 104a can be selected and outputted through the data multiplexer 106, whereby re-starting to check the validity of the series of output data 108a. In this manner, it is checked whether the tuned-down operating voltage still can make the IC chip 101 correctly process the series of predetermined data 104a and then obtain a correct series of output data 108a. If the tuned-down operating voltage still can make the IC chip 101 correctly process the series of predetermined data 104a, it means that the IC chip 101 can be operated under the tuned-down operating voltage and thus save the power consumption. On the contrary, if the tuned-down operating voltage cannot, the control unit 112 will tune the tuned-down operating voltage back to the original value.

In addition, when the resulting signal 110a presents that the series of output data 108a is invalid, the control signal 112 outputs a controlling signal 112b for tuning up the operating voltage of the tunable voltage generator 102. Meanwhile, the control unit 112 again sends the selecting signal 112a to the data multiplexer 106 such that the series of predetermined data 104a can be selected and outputted through the data multiplexer 106, whereby re-starting to check the validity of the series of output data 108a. In this manner, it is checked whether the tuned-up operating voltage can make the IC chip 101 correctly process the series of predetermined data 104a and then obtain a correct series of output data 108a. If the tuned-up operating voltage can make the IC chip 101 correctly process the series of predetermined data 104a, it means that the IC chip 101 can be operated under the tuned-up operating voltage whereby solving the problem of the performances under specification or criteria caused by unsatisfactory processes or designing margins. On the contrary, if the tuned-up operating voltage cannot, the control unit 112 can keep tuning up the operating voltage until a proper operating voltage is obtained.

Figure 2:
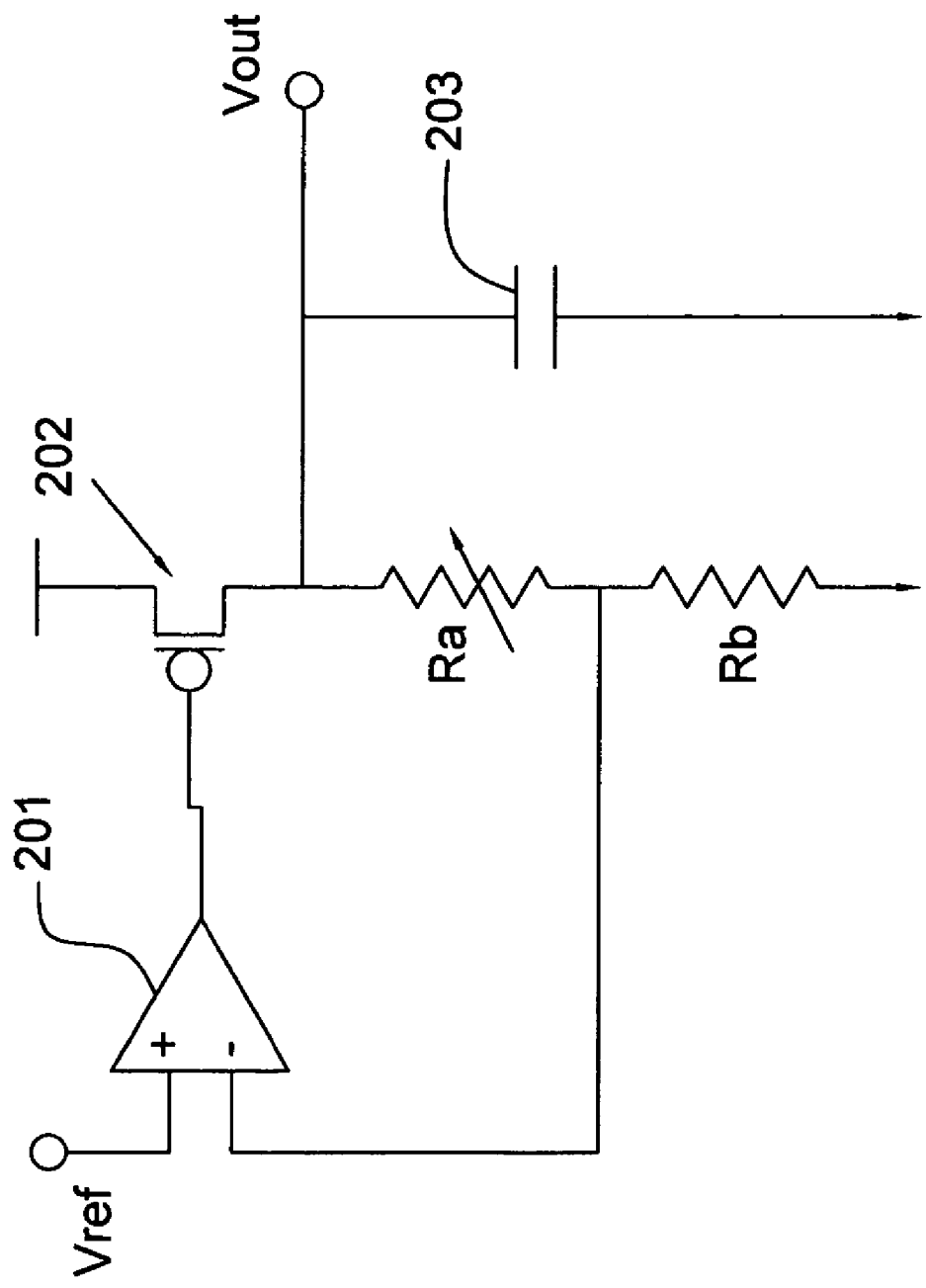
FIG. 2 is a detailed circuit of a tunable voltage generator according to one embodiment of the present invention.

FIG. 2 is a detailed circuit of the tunable voltage generator 102 according to one embodiment of the present invention. The tunable voltage generator 102 is mainly composed by an operational amplifier 201, a field effect transistor (FET) 202, a variable resistor Ra, a constant resistor Rb and a capacitor 203. The resistance value of the variable resistor Ra can be adjusted by different digital signals. The relation between the output voltage Vout and the input voltage Vref of the tunable voltage generator 102 is presented as the following equation:

$$Vout = Vref * (Ra+Rb)/Rb \quad (1)$$

In this embodiment, the controlling signal 112b outputted by the control unit 112 is a digital signal, which can adjust the resistance value of the variable resistor Ra and thus tune the output voltage Vout (i.e. the operating voltage).

Preferably, the control unit 112 can optionally include a programmable register (not shown), which can store the digital value of the controlling signal 112b and adjust the resistance value of the variable resistor according to the digital value whereby tuning the operating voltage of the tunable voltage generator 102. Therefore, the control unit 112 can tune up or tune down the operating voltage of the tunable voltage generator 102 by simply increasing or decreasing the digital value stored at the programmable register.

The following will illustrate how the control unit 112 tunes the tunable voltage generator 102 according to another embodiment of the present invention. For better illustration, it is assumed that the tunable voltage generator 102 has the input voltage Vref=10V and the constant resistor Rb=10KΩ

(ohm); in addition, the resistance value of the variable resistor Ra can be adjusted according to different digital values as shown below in Table 1.

TABLE 1

| Digital value | 000 | 001 | 010 | 011 | 100 | 101 | 110 | 111 |
|---|---|---|---|---|---|---|---|---|
| Ra(Ω) | 1K | 2K | 3K | 4K | 5K | 6K | 7K | 8K |

In this embodiment, when the adaptive power managing device 100 is activated, the control unit 112 will output a controlling signal 112b having a digital value "000" for setting the resistance value of the variable resistor Ra to 1 KΩ (ohm) such that the value of the output voltage Vout is 11V. Then, the control unit 112 will output the selecting signal 112a to the data multiplexer 106 for selecting the series of predetermined data 104a to be outputted as the series of data 106a, whereby starting to check the validity of the series of output data 108a through the data checking unit 110 and then recording whether the series of output data 108a is valid or not. Next, the control unit 112 will respectively output the controlling signal 112b having different digital values "001", "010", "011", "100", "101", "110" and "111" for respectively setting the resistance value of the variable resistor Ra to 2KΩ, 3KΩ, 4KΩ, 5KΩ, 6KΩ, 7KΩ and 8KΩ such that the checking results can be recorded (referring to Table 2 shown below) under different digital values (i.e. different output voltage Vout) according to above-mentioned steps.

TABLE 2

| digital value | 000 | 001 | 010 | 011 | 100 | 101 | 110 | 111 |
|---|---|---|---|---|---|---|---|---|
| Ra(Ω) | 1K | 2K | 3K | 4K | 5K | 6K | 7K | 8K |
| Vout(V) | 11 V | 12 V | 13 V | 14 V | 15 V | 16 V | 17 V | 18 V |
| checking result | 0 | 0 | 1 | 1 | 1 | 1 | 1 | 1 |

In Table 2, the "checking result" is the logic state presented by the resulting signal 101 a wherein the logic state "0" presents that the series of output data 108a is invalid, and the logic state "1" presents that the series of output data 108a is valid. As shown in Table 2, it could be understood that the tunable voltage generator 102 should provide at least 13V to make the IC chip operate properly. Therefore, after finishing the above checking result in Table 2, the control unit 112 will finally output the digital value "010" to the tunable voltage generator 102. Alternatively, the control unit 112 can output any digital value larger than "010" so as to cover or tolerate any unexpected result caused by any unexpected condition.

It should be understood that the adaptive power managing device 100 illustrated in the above embodiment is disposed on an IC chip; however, the present invention is not limited in this embodiment. The adaptive power managing device according to the present invention can also be disposed on any circuit system, e.g. a printed circuit board, outside an IC chip.

Although the invention has been explained in relation to its preferred embodiment, it is not used to limit the invention. It is to be understood that many other possible modifications and variations can be made by those skilled in the art without departing from the spirit and scope of the invention as hereinafter claimed.

What is claimed is:

1. An adaptive power managing device, used in a circuit system, comprising:
   a tunable voltage generator for providing the circuit system with an operating voltage;
   a data processing unit, disposed inside an IC chip, for receiving and processing a series of predetermined data and outputting a series of output data corresponding to the series of predetermined data;
   a data checking unit, disposed inside the IC chip, for receiving the series of output data and thereby generating a checking result; and
   a control unit, disposed inside the IC chip, for outputting a controlling signal in response to the checking result, wherein the controlling signal is outputted to the tunable voltage generator for adjusting the operating voltage provided to the circuit system.

2. The adaptive power managing device as claimed in claim 1, wherein the tunable voltage generator is disposed inside the IC chip.

3. The adaptive power managing device as claimed in claim 1, wherein the data checking unit comprises a checking table which stores valid checking data.

4. The adaptive power managing device as claimed in claim 3, wherein if the series of output data corresponds to at least some of the valid checking data, the checking result is valid and accordingly the operating voltage is maintained.

5. The adaptive power managing device as claimed in claim 4, wherein if the series of output data corresponds to none of the valid checking data, the checking result is invalid and accordingly the control unit outputs another controlling signal for tuning up the operating voltage.

6. The adaptive power managing device as claimed in claim 3, wherein if the series of output data corresponds to at least some of the valid checking data, the checking result is valid and accordingly the control unit outputs another controlling signal for tuning down the operating voltage.

7. The adaptive power managing device as claimed in claim 6, wherein if the series of output data corresponds to none of the valid checking data, the checking result is invalid and accordingly the control unit outputs another controlling signal for tuning up the operating voltage.

8. The adaptive power managing device as claimed in claim 1, further comprising:
   a data generator for outputting the series of predetermined data; and
   a data multiplexer having a first input coupled to the data generator, a second input coupled to a series of external data, a select line coupled to the control unit and an output coupled to the data processing unit;
   wherein the first input is used for receiving the series of predetermined data, the second input is used for receiving the series of external data, and the select line is used for receiving a selection signal from the control unit and thereby selecting one of the series of predetermined data and the series of external data to be outputted to the data processing unit.

9. The adaptive power managing device as claimed in claim 1, wherein the data checking unit utilizes CRC (Cyclical Redundancy Check) criterion to check the series of output data.

10. The adaptive power managing device as claimed in claim 1, wherein the data checking unit utilizes BER (Bit Error Rate) criterion to check the series of output data.

11. The adaptive power managing device as claimed in claim 1, wherein the circuit system is a printed circuit board.

12. The adaptive power managing device as claimed in claim 1, wherein the tunable voltage generator comprises an adjustable impedance controlled by the controlling signal, and the operating voltage is determined according to the value of the adjustable impedance.

13. An adaptive power managing method comprising following steps:
   providing an IC chip with an operating voltage;

inputting a series of predetermined data;

processing the series of predetermined data and outputting a series of output data associated with the series of predetermined data;

checking the series of output data by carrying out a CRC (Cyclical Redundancy Check) criterion and thereby generating a checking result; and adjusting the operating voltage in response to the checking result;

wherein the step of receiving and processing the series of predetermined data and the step of checking the series of output data are executed inside the IC chip.

14. An adaptive power managing method comprising following steps:

providing an IC chip with an operating voltage;

inputting a series of predetermined data;

processing the series of predetermined data and outputting a series of output data associated with the series of predetermined data;

checking the series of output data by carrying out a BER (Bit Error Rate) criterion and thereby generating a checking result; and adjusting the operating voltage in response to the checking result;

wherein the step of receiving and processing the series of predetermined data and the step of checking the series of output data are executed inside the IC chip.

15. The adaptive power managing method as claimed in claim 13, wherein the step of checking the series of output data comprises:

determining whether the series of output data correspond to at least some of valid checking data stored in an checking table of the IC chip.

16. The adaptive power managing method as claimed in claim 15, wherein if the series of output data correspond to at least some of the valid checking data, the checking result is valid and accordingly the operating voltage is maintained.

17. The adaptive power managing method as claimed in claim 15, wherein if the series of output data correspond to at least some of the valid checking data, the checking result is valid and accordingly the operating voltage is tuning down.

18. The adaptive power managing method as claimed in claim 17, wherein if the series of output data correspond to none of the valid checking data, the checking result is invalid and accordingly the operating voltage is tuning up.

19. The adaptive power managing method as claimed in claim 16, wherein if the series of output data correspond to none of the valid checking data, the checking result is invalid and accordingly the operating voltage is tuning up.

20. The adaptive power managing method as claimed in claim 14, wherein the step of checking the series of output data comprises:

determining whether the series of output data correspond to at least some of valid checking data stored in an checking table of the IC chip.

21. The adaptive power managing method as claimed in claim 20, wherein if the series of output data correspond to at least some of the valid checking data, the checking result is valid and accordingly the operating voltage is maintained.

22. The adaptive power managing method as claimed in claim 21, wherein if the series of output data correspond to none of the valid checking data, the checking result is invalid and accordingly the operating voltage is tuning up.

23. The adaptive power managing method as claimed in claim 20, wherein if the series of output data correspond to at least some of the valid checking data, the checking result is valid and accordingly the operating voltage is tuning down.

24. The adaptive power managing method as claimed in claim 23, wherein if the series of output data correspond to none of the valid checking data, the checking result is invalid and accordingly the operating voltage is tuning up.

\* \* \* \* \*